United States Patent
Huang et al.

(10) Patent No.: US 6,858,931 B2
(45) Date of Patent: Feb. 22, 2005

(54) HEAT SINK WITH COLLAPSE STRUCTURE FOR SEMICONDUCTOR PACKAGE

(75) Inventors: Chien-Ping Huang, Hsichu (TW); Chi-Chuan Wu, Taichung (TW); Jui-Yu Chuang, Taichung (TW); Lien-Chi Chan, Lien-Chi Chan (TW)

(73) Assignee: Siliconware Precision Industries Co., Ltd. (TW)

( * ) Notice: Subject to any disclaimer, the term of this patent is extended or adjusted under 35 U.S.C. 154(b) by 62 days.

(21) Appl. No.: 10/329,093

(22) Filed: Dec. 23, 2002

(65) Prior Publication Data

US 2003/0089976 A1 May 15, 2003

Related U.S. Application Data

(63) Continuation of application No. 09/946,999, filed on Sep. 5, 2001, now Pat. No. 6,538,321.

(30) Foreign Application Priority Data

Mar. 12, 2001 (TW) .......................... 90105714 A

(51) Int. Cl.⁷ .......................... H01L 23/10; H01L 23/34
(52) U.S. Cl. ........................ 257/707; 257/796
(58) Field of Search ........................ 257/707, 796

(56) References Cited

U.S. PATENT DOCUMENTS

| | | | |
|---|---|---|---|
| 5,616,957 A | * | 4/1997 | Kajihara ..................... 257/712 |
| 5,851,337 A | | 12/1998 | Chen |
| 5,869,891 A | * | 2/1999 | Rostoker et al. ............ 257/712 |
| 5,883,430 A | * | 3/1999 | Johnson ...................... 257/706 |
| 6,278,182 B1 | * | 8/2001 | Liu et al. .................... 257/712 |
| 6,538,321 B2 | * | 3/2003 | Huang et al. ............... 257/706 |

FOREIGN PATENT DOCUMENTS

| | | | | |
|---|---|---|---|---|
| JP | 60-137042 | * | 7/1985 | ................ 257/796 |
| JP | 63-044749 | * | 2/1988 | ................ 257/796 |

* cited by examiner

*Primary Examiner*—Howard Weiss
(74) *Attorney, Agent, or Firm*—Peter F. Corless; Steven M. Jensen; Edwards & Angell, LLP

(57) ABSTRACT

A heat sink with a collapse structure and a semiconductor device with the heat sink are proposed, in which the heat sink is in ladder-like shape due to a height difference formed between an extending portion and an body of the heat sink, and the body has at least one surface exposed to outside of the semiconductor package. The extending portion produces collapse deformation in response to stress from engagement of molds in a molding process, so as to prevent a semiconductor chip from being damaged by the stress. The heat sink directly attached to the chip allows heat generated by the chip to pass through the extending portion to the body of the heat sink, and then the heat can be dissipated through the exposed surface of the body to the outside of the semiconductor package, so as to improve the heat dissipating efficiency.

6 Claims, 5 Drawing Sheets

HEAT SINK WITH COLLAPSE STRUCTURE FOR SEMICONDUCTOR PACKAGE

CROSS-REFERENCE TO RELATED APPLICATION(S)

This application is a continuation of application U.S. Ser. No. 09/946,999, filed on Sep. 5, 2001, now U.S. Pat. No. 6,538,321.

FIELD OF THE INVENTION

The present invention relates to heat sinks and semiconductor packages with the heat sinks, and more particularly, to a heat sink with a collapse structure and a semiconductor package with the heat sink, in which a semiconductor chip is not damaged during a molding process.

BACKGROUND OF THE INVENTION

In the technology development for fabricating a semiconductor package, leads used as I/O connections are increasingly disposed in number and density in the semiconductor package. Further, due to enhancement in integrated circuit performance for a semiconductor chip, heat generated by the chip is accordingly increased. Therefore, it is critical for the heat to be effectively dissipated to the atmosphere, so as to assure the quality of the chip and semiconductor package.

In order to solve the heat dissipating problem for the semiconductor package, conventionally a heat sink or heat block made of conductive metal such as copper or aluminum is applied to the semiconductor package, or alternatively, cooled air or liquid is passed through a surface of the semiconductor package, so as to allow the heat generated by the chip to be effectively and rapidly dissipated to the atmosphere. Moreover, shortening a heat dissipating path is advantageous for improving heat dissipating efficiency. That is, if the semiconductor package is constructed in a manner that, the heat spreader or heat block comes into direct contact with the chip and has a surface thereof exposed to outside of an encapsulant in the semiconductor package, the shortest heat dissipating path can be achieved, and thus the heat dissipating efficiency can be effectively improved.

U.S. Pat. No. 5,851,337 provides a semiconductor package with an exposed heat sink. As shown in FIG. 1, this semiconductor package comprises a substrate 1; a semiconductor chip 2 mounted on the substrate 1; a plurality of cove elements 3 such as gold wires for electrically connecting the substrate 1 to the chip 2; and an exposed heat sink 4 attached to the substrate 1 and the chip 2 respectively by means of an adhesive 6; an encapsulant 5 for encapsulating the substrate 1, the chip 2, the conductive elements 3 and the heat sink 4; and a plurality of solder balls 7 implanted on an exposed surface of the substrate 1. As the heat sink 4 is in direct contact with the chip 2, heat generated by the chip 2 can be easily dissipated through an exposed sure of the heat sink 4 to the atmosphere or to a heat dissipating device (not shown), such as a heat pipe or fan, externally attached to the exposed surface of the heat ink 4. This therefore makes the semiconductor package significantly improved in heat dissipating efficiency.

However, in a molding process for the semiconductor package disclosed in the foregoing U.S. Pat. No. 5,851,337, as shown in FIG. 2, it occurs that the heat sink 4 is pressed by an upper mold 8a and a lower mold 8b during engaging the molds, due to the heat sink 4 having a height greater than a depth of a molding cavity. This then makes the chip 2 pressed by the heat sink 4, and eventually results in damage or cracks 9 on the chip 2. In this case, the package quality and fabrication cost are undesirably affected. The reason for the heat sink 4 excessive in height is that the adhesive 6 used for attaching the heat sink 4 to both the substrate 1 and the chip 2 is hardly controlled in thickness. That is, if the adhesive 6 is made too thick, then the height of the heat sink 4 will exceed the depth of the molding cavity. Besides, dimensional inaccuracy in manufacture for the heat sink 4 can also lead to the heat sink 4 higher in elevation than the depth of the molding cavity.

SUMMARY OF THE INVENTION

A primary objective of the present invention is to provide a heat sink with a collapse structure and a semiconductor package with the heat sink, in which heat dissipating efficiency can be effectively improved, and a semiconductor chip can be prevented from being damaged in a molding process due to an adhesive excess in amount for attaching the heat sink to the chip, or due to dimensional inaccuracy in fabrication for the heat sink.

In accordance with the foregoing and other objectives, a heat sink with a collapse structure is proposed in the invention, comprising a body having at least one surface exposed to outside of an encapsulant of a semiconductor package, and at least one extending portion extending from a bottom surface of the body inwardly and then bending downwardly to a position for attaching a semiconductor chip thereto. In this case, the heat sink is in the form of a ladder-like structure due to a difference in height formed between the extending portion and the body. Accordingly, in a molding process for the semiconductor package having the heat sink, the height difference of the heat sink allows the extending portion to produce collapse deformation without causing damage to the semiconductor chip. Further, heat generated by the semiconductor chip can pass through the extending portion to the body of the heat sink, so as to dissipate the heat through the exposed surface of the body to the atmosphere or to a heat dissipating device externally connected to the exposed surface. This therefore effectively improves heat dissipating efficiency for the semiconductor package.

In addition, at side edges on the exposed surface of the heat sink there can also be optionally formed at least one ladder-like recess. This allows a molding compound used in the molding process to be significantly reduced in fluidity and then retained in the recess, so as to prevent the molding compound from flashing on the exposed surface of the heat sink, and thus the quality of the semiconductor package can be assured.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1:
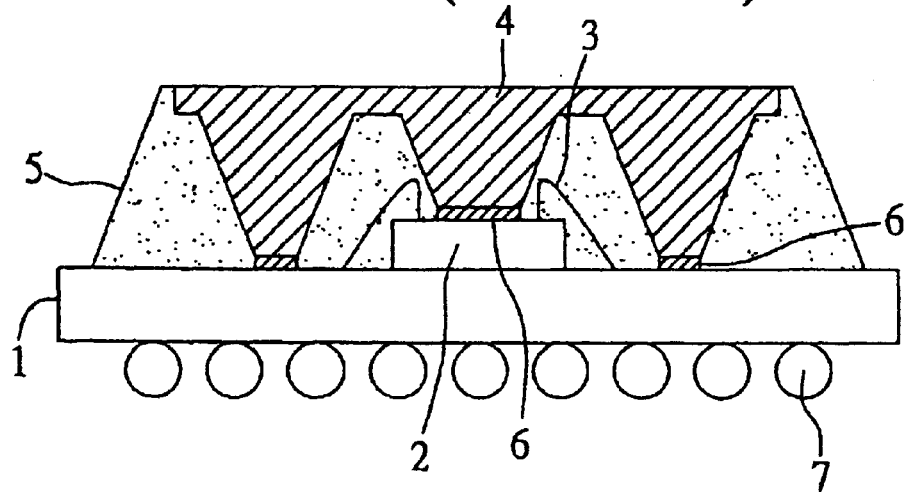
FIG. 1 (PRIOR ART) is a sectional view of a conventional semiconductor package with a heat sink.
Figure 2:
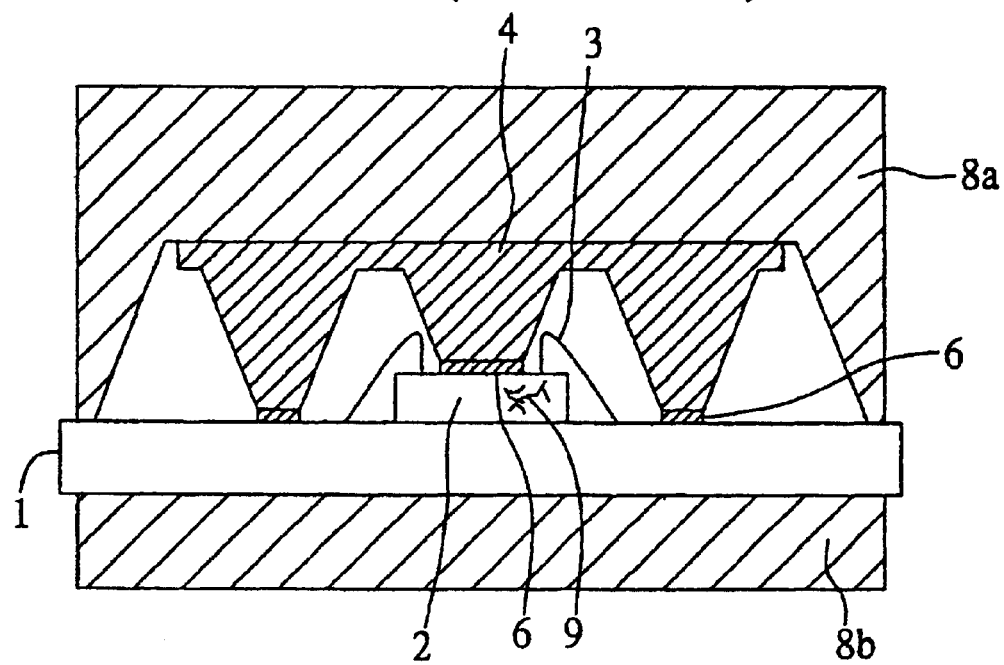
FIG. 2 (PRIOR ART) is a schematic diagram of the conventional semiconductor package in FIG. 1 during a molding process.
Figure 3:
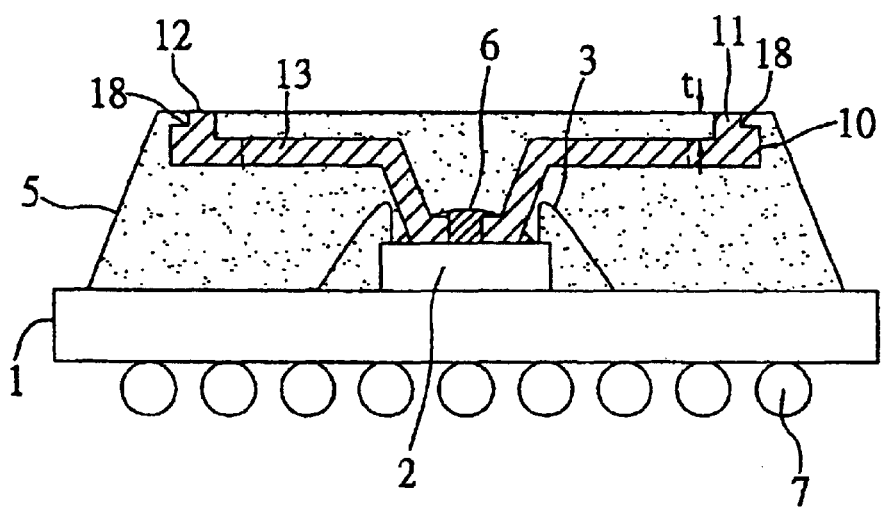
FIG. 3 is a sectional view of a preferred embodiment of the semiconductor package of the invention.

As shown in FIG. 3, a preferred embodiment of the semiconductor package of the invention comprises a substrate 1, a semiconductor chip 2 mounted on the substrate 1; a plurality of conductive elements such as gold wires for electrically connecting the substrate 1 to the semiconductor chip 2; an exposed heat sink 10 having a collapse structure and made of conductive metal such as copper or aluminum, for being directly attached to the semiconductor chip 2 by an adhesive 6; an encapsulant 5 for encapsulating the substrate 1, the semiconductor chip 2, the conducive elements 3, and the heat sink 10; and a plurality of solder balls 7 implanted on an exposed surface of the substrate 1.

Figure 4:
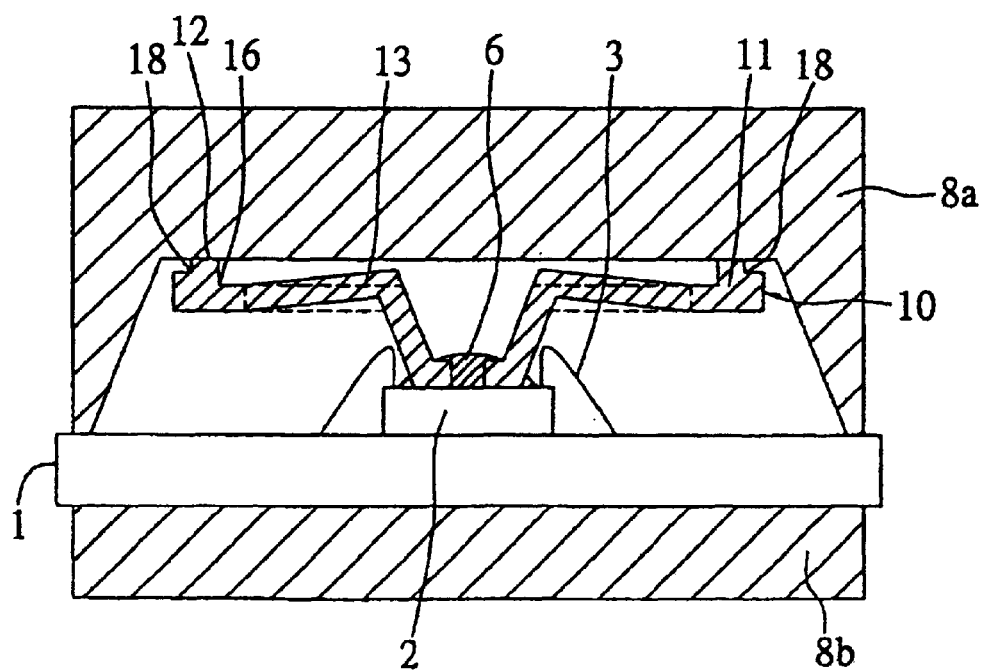
FIG. 4 is a schematic diagram of the preferred embodiment of the invention in FIG. 3 during a molding process.

The heat sink 10 having the collapse structure substantially comprises a body 11 having at least one surface 12 exposed to outside of the encapsulant 5, and at least one extending portion 13 inwardly extending from a bottom surface of the body 11 and then downwardly bending to a position for attaching the semiconductor chip 2 thereto. In this case, the heat sink 10 is in the form of a ladder-like structure due to a height difference t formed between the extending portion 13 and the body 11. Accordingly, as shown in FIG. 4, in a molding process, the heat sink 10 is possibly constructed to be higher in elevation than a depth of a molding cavity, due to excess amount of the adhesive 6 used in the attachment of the heat sink 10 to the semiconductor chip 2 or dimensional inaccuracy in fabrication for the heat sink 10. In this case, the extending portion 13 having the height difference t can absorb stress generated by engagement of an upper mold 8a with a lower mold to the heat sink 10, and produce collapse deformation (shown as dotted lines). This prevents the stress from transferring to the semiconductor chip 2, and thus assures the semiconductor chip 2 to be free of cracking damage.

Moreover, heat generated by the semiconductor chip 2 can be dissipated to outside of the semiconductor package through the shortest heat dissipating path, that is, the heat passes through the extending portion 13, which is in direct contact with the semiconductor chip 2, to the body 11 of the heat sink 10, and then the heat is dissipated through the exposed surface 12 of the body 11 to the atmosphere or to a heat dissipating device externally connected to the exposed surface 12. This therefore effectively improves heat dissipating efficiency for the semiconductor package.

Figure 5:
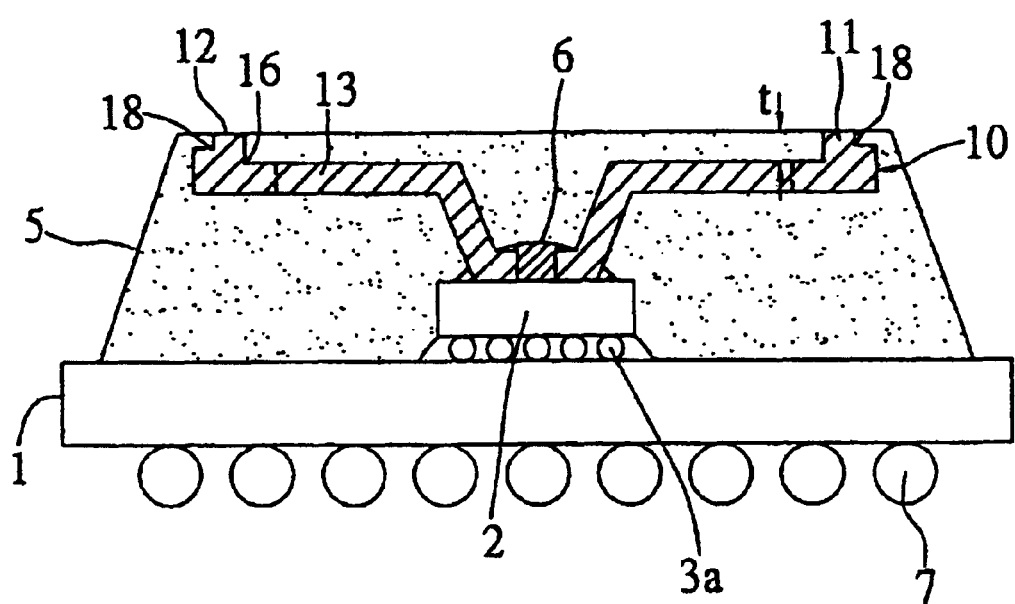
FIG. 5 is a sectional view of another preferred embodiment of the semiconductor package of the invention.

Further, the heat sink 10 having the collapse structure can also be applied to a flip chip semiconductor package shown in FIG. 5, wherein a plurality of solder balls 3a, instead of the gold wires 3 as previously depicted, are used as the conductive elements for electrically connecting the substrate 1 to the semiconductor chip 2.

Figure 6:
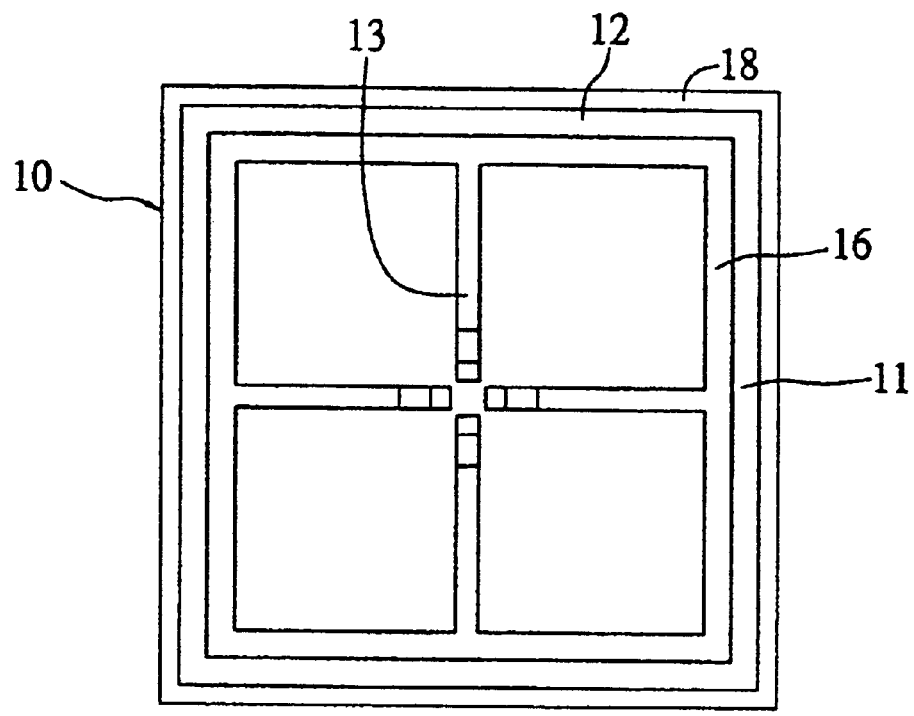
FIG. 6 is a top view of the heat sink of the invention in FIG. 3.
Figure 7:
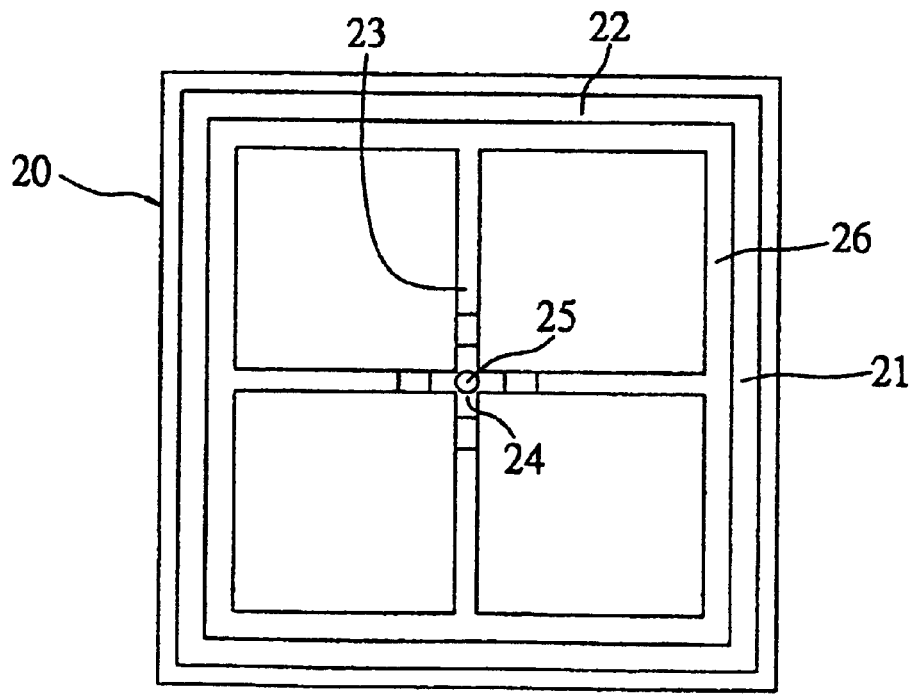
FIG. 7 is a top view of another preferred embodiment of the heat sink of the invention.

As shown in FIG. 6, the heat sink 10 as mentioned above is formed with a ladder-like portion 16 having a height difference with respect to the body 11, and a plurality of independently extending portions 13 extending inwardly from the ladder-like portion 16. Alternatively, as shown in FIG. 7, a heat sink 20 can be constructed in a manner as to form a connecting portion 24 by connecting ends of inwardly extending portions 23 to one another, while the connecting portion 24 is formed with a via 25 in various shape e.g. round shape, so as to allow air in the adhesive 6 to escape through the via 25 in the attachment of the heat sink 20 to a surface of the semiconductor chip 2.

Figure 8:
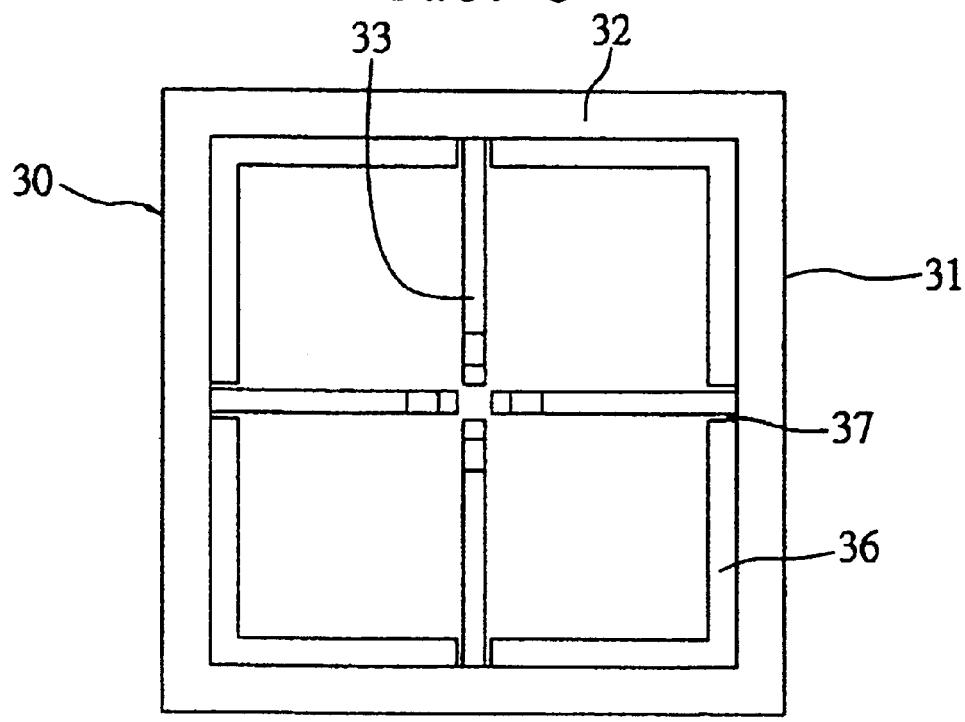
FIG. 8 is a top view of a further preferred embodiment of the heat sink of the invention.

In addition, as shown in FIG. 8, a heat sink 30 of the invention can further be constructed in a manner that a plurality of spacing means 37 are formed between two sides of extending portions 33 and ladder-like portions 36, for increasing dislocating range of the extending portions 33 in an up-down direction, so that the extending portions 33 can sustain collapse deformation to a higher extent under stress.

Figure 9:
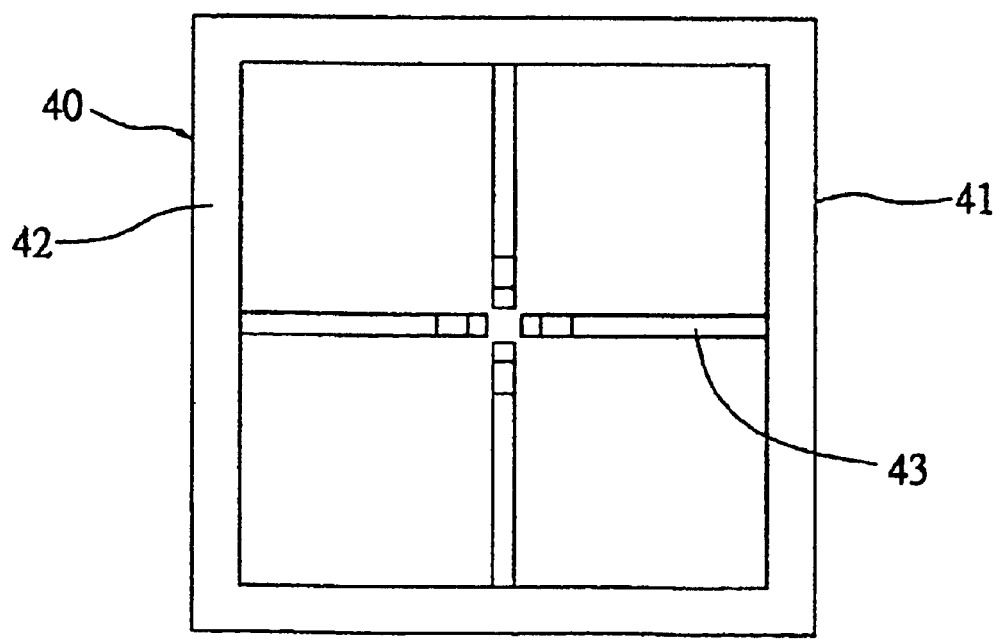
FIG. 9 is a top view of a further preferred embodiment of the heat sink of the invention.

As shown in FIG. 9, in exclusion of a ladder-like portion, a heat sink 40 of the invention is formed only with a body 41 and a plurality of extending portions 43. Nevertheless, the same improvements can also be achieved by the heat sink 40 as those depicted in the foregoing embodiments.

Furthermore, in order to prevent a molding compound used for forming the encapsulant from flashing on the exposed surface of the heat sink, as shown in FIGS. 3–6, at side edges on the exposed surface 12 of the body 11 of the heat sink 10 there can be optionally formed at least one ladder-like recess 18. As such, in the molding process, a flow runner for the molding compound narrows down due to the construction of the ladder-like recess 18. This makes the molding compound become more viscous and accordingly reduced in fluidity, and thus the molding compound can be retained in the ladder-like recess 18 and prevented from flashing on the heat sink 10.

In addition, the construction of the extending portion, ladder-like portion and ladder-like recess for the heat sink allows a path for external moisture entering into inside of the semiconductor package to be greatly increased, in an effort to help protect the inside of the semiconductor package against the external moisture. This therefore reduces evaporation and volume expansion of moisture hidden in gaps in the semiconductor package due to a high temperature generated during operating the semiconductor chip, so as to prevent delamination from occurring in the encapsulant, and assure the reliability and quality for the semiconductor package.

The invention has been described using exemplary preferred embodiments. However, it is to be understood that the scope of the invention is not limited to the disclosed embodiments. On the contrary, it is intended to cover various modifications and similar arrangements. For example, the heat sink in square shape shown in FIGS. 6–9 can be alternatively constructed to be of a geometrical shape such as circle, rhombus, polygon, ellipse or star-shape; or features depicted in the foregoing embodiments, such as the construction of the connecting portion at the ends of the extending portions, the provision of the spacing means between the extending portions and the ladder-like portions, the exclusion of the ladder-like portion or the formation of the ladder-like recess, can be freely employed in any combination thereof. The scope of the claims, therefore, should be accorded the broadest interpretation so as to encompass all such modifications and similar arrangements.

What is claimed is:

1. A heat sink with a collapse structure, comprising:

a body having at least one surface exposed to outside of an encapsulant of a semiconductor package;

one or more extending portions extending inwardly from a bottom surface of the body and then bending downwardly to a position for attaching a semiconductor chip thereto, such that the heat sink is in a ladder shape due to a height difference formed between the extending portion and the body; and a connecting part formed with a via by connecting ends of the extending portions of the heat sink.

2. The heat sink of claim 1, wherein the heat sink is formed with a ladder-shaped portion having a height difference with respect to the body, and at least one independently extending portion extending inwardly from the ladder-shaped portion.

3. The heat sink of claim 2, wherein at least one ladder-shaped recess is formed at side edges on the exposed surface of the heat sink.

4. The heat sink of claim 2, wherein a spacing means is formed respectively between two sides of the extending portion and the ladder-shaped portion.

5. The heat sink of claim 4, wherein at least one ladder-shaped recess is formed at side edges on the exposed surface of the heat sink.

6. The heat sink of claim 1, wherein at least one ladder-shaped recess is formed at side edges on the exposed surface of the heat sink.

* * * * *